(12) United States Patent
Jang et al.

(10) Patent No.: US 7,872,918 B2
(45) Date of Patent: Jan. 18, 2011

(54) NONVOLATILE MEMORY DEVICE AND PROGRAM OR ERASE METHOD USING THE SAME

(75) Inventors: Chae Kyu Jang, Gyeonggi-do (KR); Seung Ho Chang, Chungcheongbuk-do (KR); Young Soo Park, Seoul (KR); Jae Yun Kim, Jeollanam-do (KR); Se Chun Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 24 days.

(21) Appl. No.: 12/493,288

(22) Filed: Jun. 29, 2009

(65) Prior Publication Data

US 2010/0008137 A1    Jan. 14, 2010

(30) Foreign Application Priority Data

Jul. 10, 2008  (KR) .................. 10-2008-0066878

(51) Int. Cl.
*G11C 16/06* (2006.01)

(52) U.S. Cl. .................. 365/185.2; 365/185.17; 365/185.21; 365/189.07

(58) Field of Classification Search ............. 365/185.2, 365/185.17, 185.21, 189.07
See application file for complete search history.

(56) References Cited

U.S. PATENT DOCUMENTS

2009/0103365 A1*  4/2009  Roohparvar et al. ... 365/185.17

FOREIGN PATENT DOCUMENTS

JP           10-241388        9/1998

OTHER PUBLICATIONS

Notice of Preliminary Rejection issued from Korean Intellectual Property Office on Feb. 18, 2010.

* cited by examiner

*Primary Examiner*—Thong Q Le
(74) *Attorney, Agent, or Firm*—IP & T Group LLP

(57) ABSTRACT

A nonvolatile memory device includes a comparison unit configured to compare a reference voltage and a voltage of each of a plurality of nodes of a sample memory cell string, a state storage unit configured to store state information of each of memory cells depending on the corresponding comparison result of the comparison unit, and a high voltage generation unit configured to change a program start voltage depending on data stored in the state storage unit.

11 Claims, 7 Drawing Sheets

(a)  (b)

FIG. 4
(a)
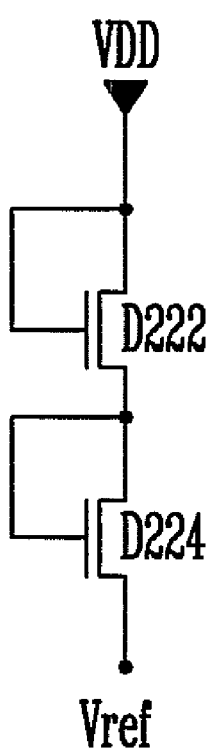
(b)
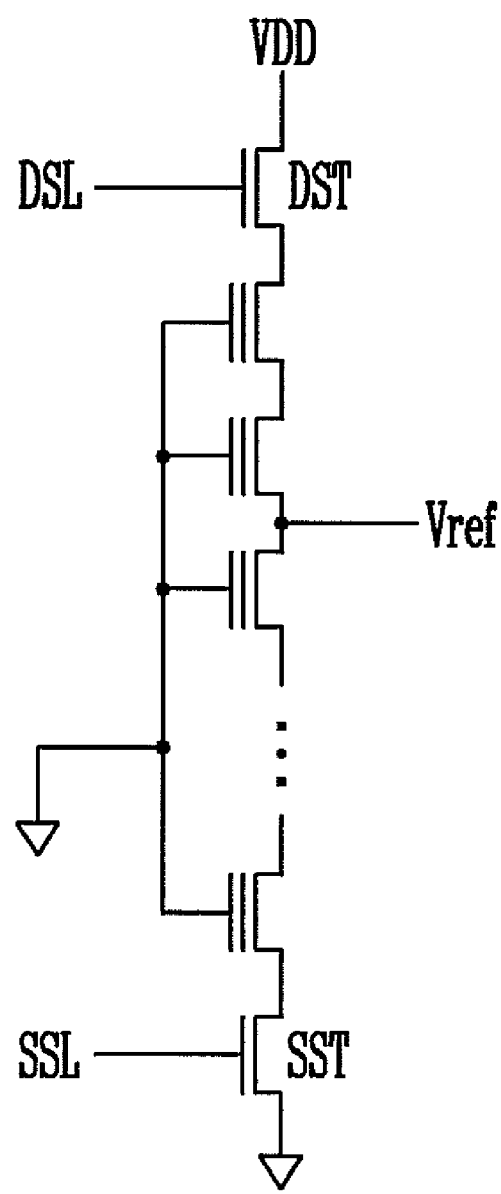
220

NONVOLATILE MEMORY DEVICE AND PROGRAM OR ERASE METHOD USING THE SAME

CROSS-REFERENCES TO RELATED APPLICATIONS

The present application claims priority to Korean patent application number 10-2008-0066878, filed on Jul. 10, 2008, which is incorporated by reference in its entirety.

BACKGROUND

One or more embodiments relate to a nonvolatile memory device and a program method and an erase method using the same.

Recently, there has been an increasing demand for nonvolatile memory devices which can be electrically programmed and erased and do not require the refresh function of rewriting data at specific periods.

A nonvolatile memory cell enables electrical program/erase operations and performs the program and erase operations by varying a threshold voltage when electrons are migrated by a strong electric field applied to a thin oxide layer.

The nonvolatile memory device typically includes a memory cell array in which cells for storing data are arranged in matrix form and a page buffer for writing data into specific cells of the memory cell array or reading data stored in specific cells thereof. The page buffer includes bit line pairs connected to specific memory cells, a register for temporarily storing data to be written into the memory cell array or reading the data of specific cells from the memory cell array and temporarily storing the read data, a sensing node for detecting the voltage level of a specific bit line or a specific register, and a bit line select unit for controlling whether to connect the specific bit line to the sensing node.

The memory cell of this nonvolatile memory device may experience a phenomenon in which, despite performing an erase operation, electric charges are trapped in the oxide layer and the floating gate with the increasing number of program/erase cycles. With the increasing number of program/erase cycles, the amount of the trapped electric charges also increases, resulting in an increased threshold voltage of the nonvolatile memory cell. Consequently, the program speed increases. In order to compensate for the increase in the trapped charges or the program speed owing to the increase in the number of program/erase cycles, it may be necessary to change a program voltage or an erase voltage.

BRIEF SUMMARY

One or more embodiments are directed towards a nonvolatile memory device which is capable of applying a different program voltage or a different erase voltage depending on the increase in the number of program/erase cycles.

One or more embodiments are directed to a nonvolatile memory device includes a comparison unit configured to compare a reference voltage and a voltage of each of a plurality of nodes of a sample memory cell string, a state storage unit configured to store state information of each of memory cells depending on the corresponding comparison result of the comparison unit, and a high voltage generation unit configured to change a program start voltage depending on data stored in the state storage unit.

One or more embodiments are directed to a program method using a nonvolatile memory device, including performing a program operation according to a selected program start voltage, comparing a reference voltage and each of output voltages of specific nodes of sample memory cells, repeatedly performing the program operation until each of the output voltages is greater than the reference voltage by increasing a program voltage by a step voltage at each repetition compared to that of the previous program operation, storing state information, indicating that each of the output voltages is higher than the reference voltage whenever a selected program/erase cycle is completed, and changing a level of the program start voltage depending on the stored state information.

One or more embodiments are directed to an erase method using a nonvolatile memory device, including performing an erase operation according to a selected erase start voltage, comparing a reference voltage and each of output voltages of specific nodes of sample memory cells, repeatedly performing the erase operation until each of the output voltages is greater than the reference voltage by increasing an erase voltage by a step voltage at each repetition compared to that of the previous program operation, storing state information, indicating that each of the output voltages is higher than the reference voltage whenever a selected erase/erase cycle is completed, and changing a level of the erase start voltage depending on the stored state information.

BRIEF DESCRIPTION OF THE DRAWINGS

FIG. 4 is a circuit diagram of a reference voltage generation unit according to an embodiment;

DESCRIPTION OF SPECIFIC EMBODIMENT

Hereinafter, the present disclosure will be described in detail in connection with one or more embodiments with reference to the accompanying drawings. The figures are provided to allow those having ordinary skill in the art to understand the scope of one or more embodiments of the disclosure. In showing multiple layers and regions, the thickness of the layers is exemplary and may not be exact.

Figure 1:
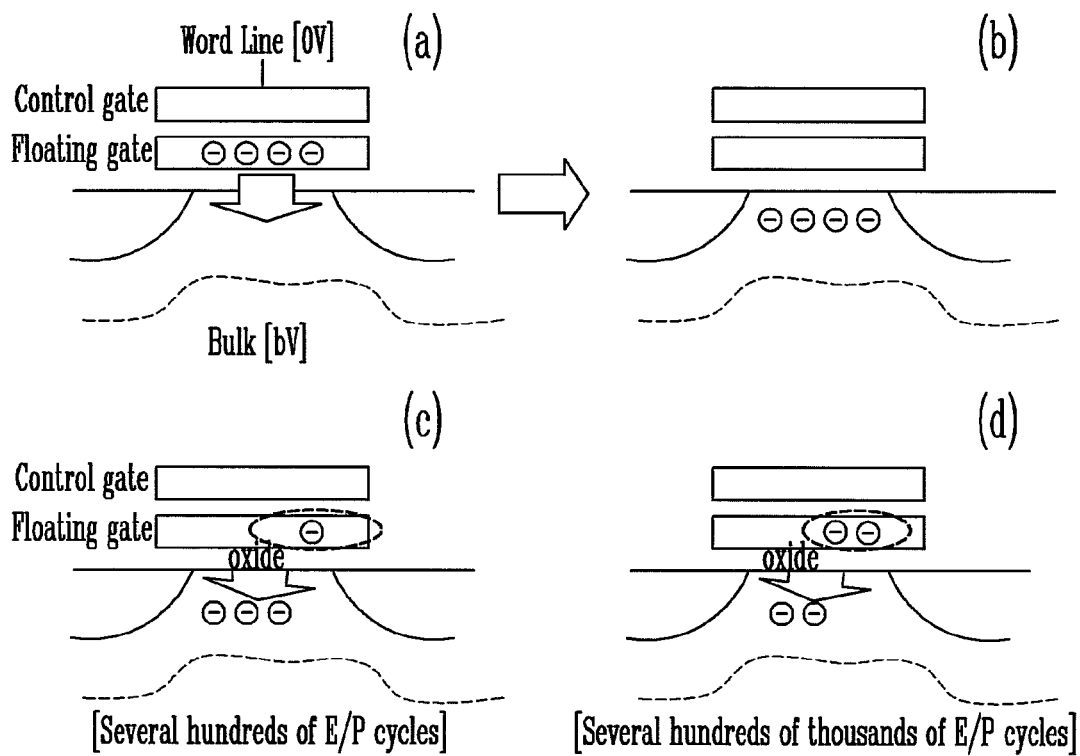
FIG. 1 is a diagram showing a charge trapping phenomenon depending on the increase in the number of program/erase cycles in a known nonvolatile memory device.

FIG. 1 is a diagram showing a charge trapping phenomenon that depends on the increase in the number of program/erase cycles in a known nonvolatile memory device.

An erase operation using a known nonvolatile memory device is performed by applying voltage of 0 V to a word line and high voltage of 20 V to a bulk so that electric charges stored in a floating gate are discharged to a channel, as shown in FIG. 1(a). Here, the high voltage may be repeatedly applied to the bulk in pulse form using an Incremental Step Pulse Erase (ISPE) method. If the erase operation is performed as described, all of the electric charges stored in the floating gate are to be discharged to the channel as shown in FIG. 1(b).

However, there may occur a phenomenon in which, despite the erase operation, electric charges are trapped in an oxide layer and the floating gate with the increasing number of program/erase cycles. With the increasing number of program/erase cycles, the amount of the trapped electric charges may also increase, resulting in an increased threshold voltage of the nonvolatile memory cell. Consequently, the program speed increases, where, although a low program voltage is applied, the threshold voltage is programmed to exceed a reference voltage. According to an Incremental Step Pulse Program (ISPP) method, a program operation may be completed even though small program pulses are applied. In order to compensate for the increase in the trapped charges or the program speed owing to the increase in the number of program/erase cycles, it may be necessary to change a program voltage or read and verification reference erase voltages.

Figure 2:
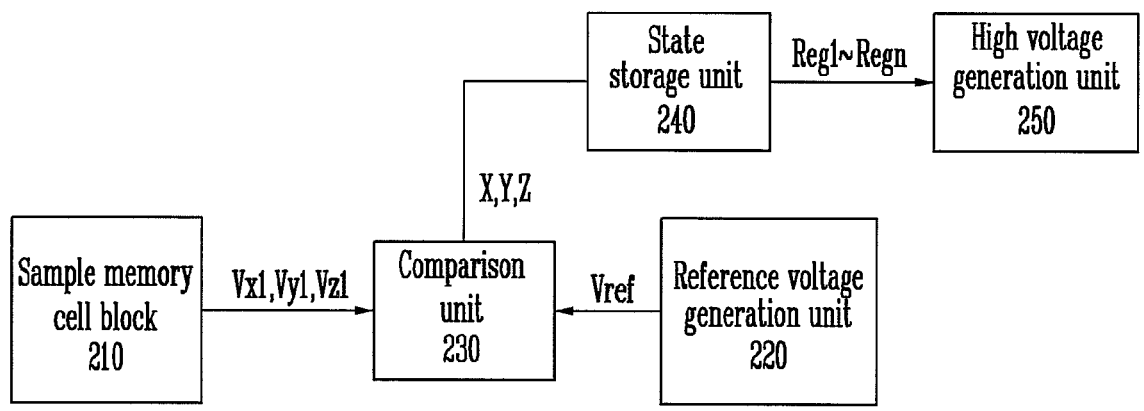
FIG. 2 is a block diagram of a nonvolatile memory device according to an embodiment.

FIG. 2 is a block diagram of a nonvolatile memory device according to an embodiment.

The nonvolatile memory device 200 includes a sample memory cell block 210, a reference voltage generation unit 220, a comparison unit 230, a state storage unit 240, and a high voltage generation unit 250. The comparison unit 230 compares each of voltages Vx1, Vy1, and Vz1, applied to respective specific nodes of the memory cell string of the sample memory cell block 210, and a reference voltage Vref received from the reference voltage generation unit 220 and outputs comparison results X, Y, and Z. The state storage unit 240 stores the comparison results X, Y, and Z in the form of pieces of state information Reg1 to Regn of memory cells. The high voltage generation unit 250 controls the voltage level of a program voltage or an erase voltage depending on the state information Reg1 to Regn of the memory cells, stored in the state storage unit 240.

The memory cells of the sample memory cell block 210 have the same characteristic as the memory cells of a target nonvolatile memory cell device to which the program voltage or the erase voltage is to be applied. This is described in detail below with reference to the drawing.

Figure 3:
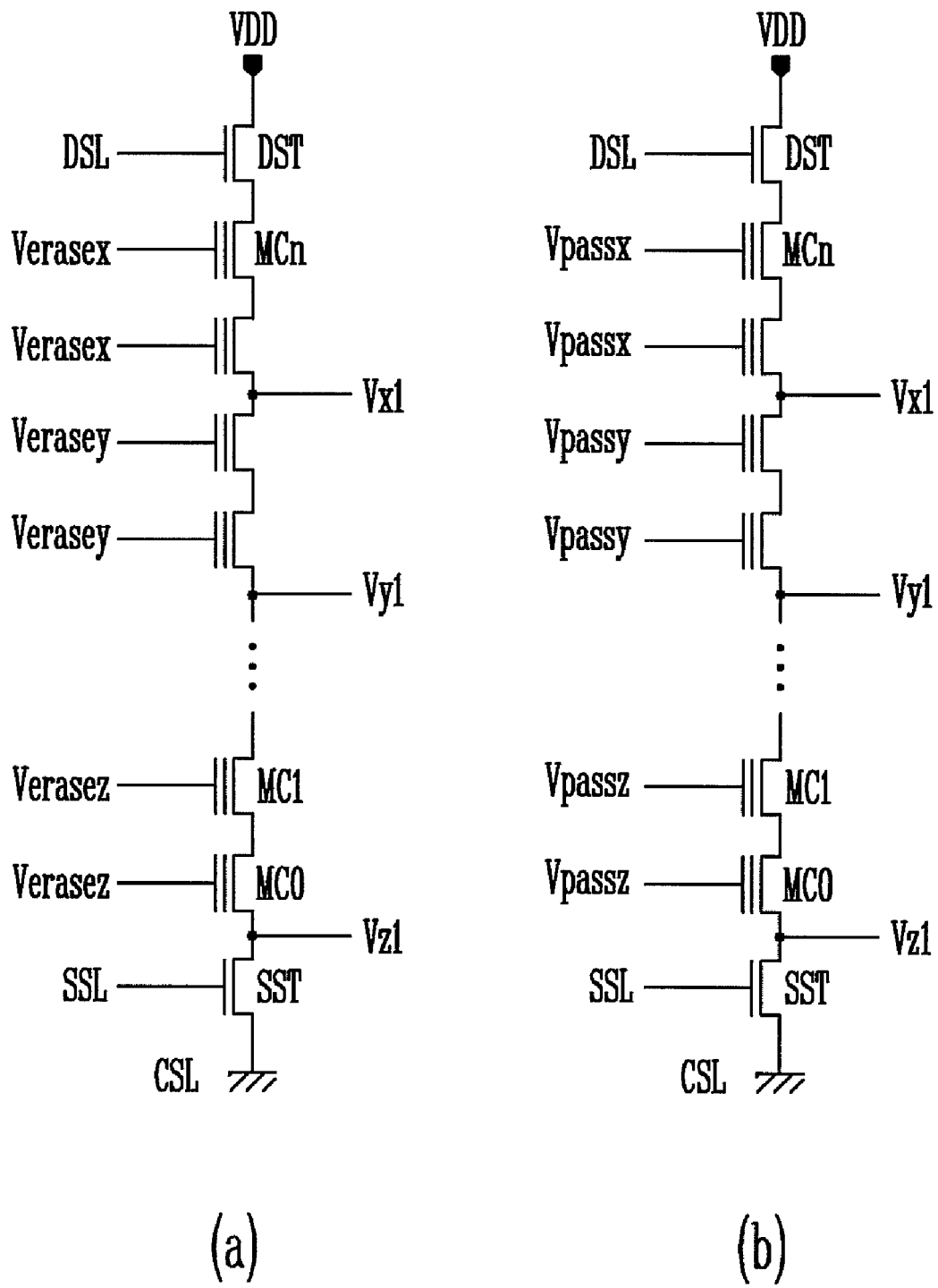
FIG. 3 is a circuit diagram of a memory cell string included in a sample memory cell block according to an embodiment.

FIG. 3 is a circuit diagram of a memory cell string included in the sample memory cell block according to an embodiment.

The memory cell string has a similar construction as the memory cell string of a known NAND nonvolatile memory device. That is, the memory cell string includes memory cells MC0 to MCn connected in series, a drain select transistor DST configured to selectively connect the memory cell MCn and a bit line, and a source select transistor SST configured to selectively connect the memory cell MC0 and a common source line CSL. According to one or more embodiments, the memory cell string further includes output terminals Vx1, Vy1, and Vz1 applied to nodes between the respective memory cells.

Meanwhile, FIG. 3(a) shows the construction of a memory cell string according to a method of measuring voltage at the output terminals when an erase operation is performed, and FIG. 3(b) shows the construction of a memory cell string according to a method of measuring voltage at the output terminals when a program operation is performed. FIGS. 3(a) and 3(b) have the same construction except for voltages applied to respective word lines (i.e., erase verification voltages Verasex, Verasey to Verasez in FIG. 3(a) and pass voltages Vpassx, Vpassy to Vpassz in FIG. 3(b)).

A state where the erase operation has been completed or a state where the program operation has been completed can be checked through the output terminals. In FIG. 3(a), the erase verification voltages Verasex, Verasey to Verasez are applied in the state where the bit line is precharged to a high level VDD. If all of the cells have been erased, the threshold voltage of each of the cells will be lower than the erase verification voltage, each of the cells is turned on, and all voltages applied to the output terminals Vx1, Vy1, and Vz1 will have a high level. However, if there is any cell that has not been erased, the output terminals Vx1, Vy1, and Vz1 will have different levels depending on the states of the cells. In a similar way, in FIG. 3(b), the pass voltages Vpassx, Vpassy to Vpassz are applied in the state where the bit line is precharged to a high level VDD. If all of the cells have been erased, the threshold voltage of each of the cells will be lower than the pass voltage, each of the cells is turned on, and all voltages applied to the output terminals Vx1, Vy1, and Vz1 will have a high level.

However, if there are cells that have not been erased, the output terminals Vx1, Vy1, and Vz1 will have different levels depending on the states of the cells.

The reference voltage generation unit 220 outputs a reference voltage which will be compared with each of voltages of the output terminals Vx1, Vy1, and Vz1, output from the sample memory cell block 210. This is described in detail below with reference to the drawing.

FIG. 4 is a circuit diagram of the reference voltage generation unit according to an embodiment.

The reference voltage generation unit 220 may have two kinds of constructions as shown in FIG. 4. In FIG. 4(a), the reference voltage generation unit 220 includes diodes D222 and D224 connected in series between a power supply terminal VDD and a reference voltage output terminal Vref. In this construction, although the reference voltage output terminal Vref may have a different voltage depending on the threshold voltage level of a diode, the reference voltage output terminal Vref has a voltage of about 1.0 to 0.7 V when the level of the power supply terminal VDD is 2.0 to 1.4 V.

In FIG. 4(b), the cell string of a nonvolatile memory device is used. That is, in the state where all of the memory cells of the cell string have been erased, a voltage of 0 V is applied to the word lines of the memory cells. A power supply voltage VDD is applied to a bit line. Each of the memory cells is turned on because it has been erased. Accordingly, voltage Vref output from a node between specific memory cells becomes a high level. This voltage is used as a reference voltage.

The comparison unit 230 compares each of voltages at the respective output terminals Vx1, Vy1, and Vz1 of the cell string, received from the sample memory cell block 210, and the reference voltage Vref received from the reference voltage generation unit 220. A detailed construction of the comparison unit 230 is described below with reference to the drawings.

Figure 5:
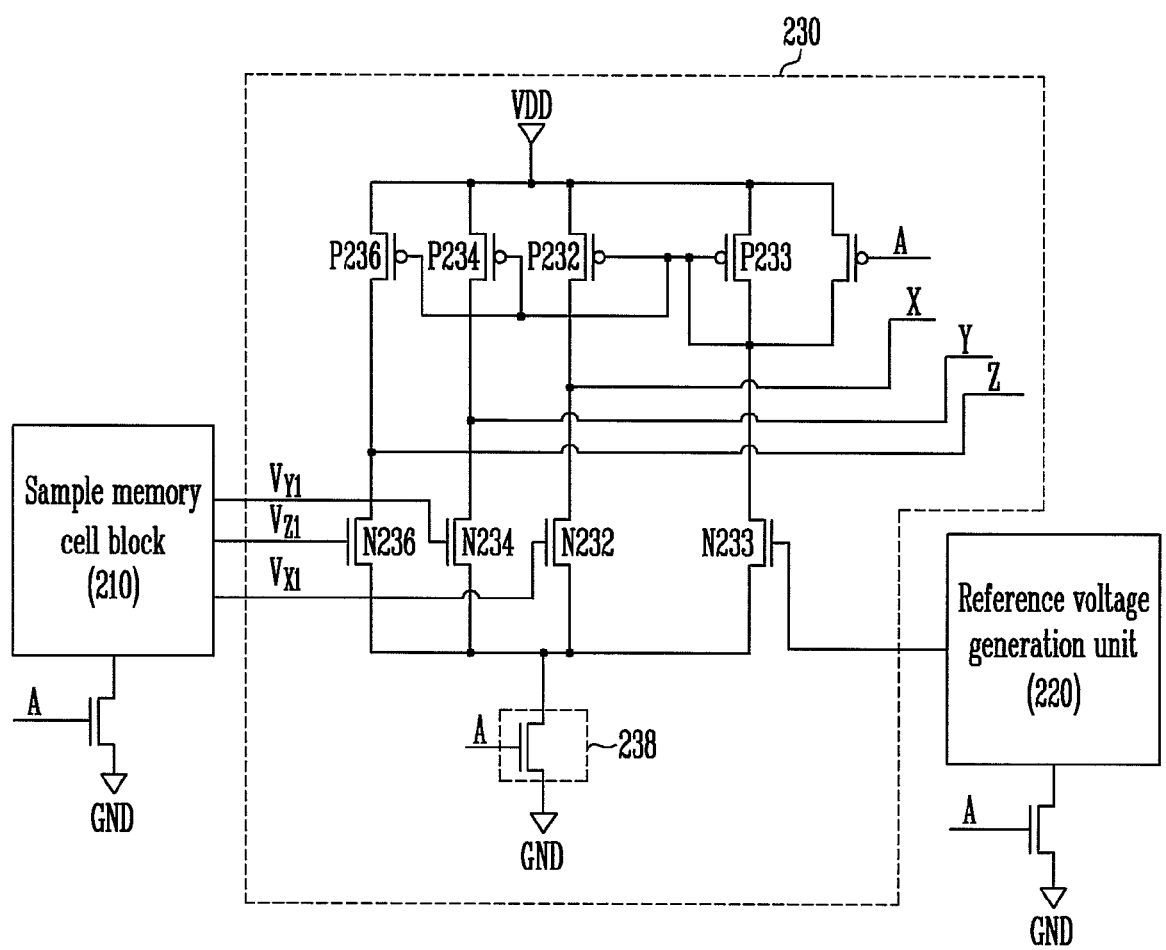
FIG. 5 is a circuit diagram of a comparison unit according to an embodiment.

FIG. 5 is a circuit diagram of the comparison unit according to an embodiment.

The comparison unit 230 includes a first differential amplification unit, a second differential amplification unit, a third differential amplification unit, and a driving unit 238. The first differential amplification unit compares the first output voltage Vx1 of the sample memory cell block 210 and the reference voltage Vref of the reference voltage generation unit 220. The second differential amplification unit compares the second output voltage Vy1 of the sample memory cell block 210 and the reference voltage Vref of the reference voltage generation unit 220. The third differential amplification unit compares the third output voltage Vz1 of the sample memory cell block 210 and the reference voltage Vref of the reference voltage generation unit 220. The driving unit 238 supplies a ground voltage in response to a driving signal A.

The first differential amplification unit includes a PMOS transistor P232, an NMOS transistor N232, a PMOS transistor P233, and an NMOS transistor N233 all of which are connected between a power supply voltage terminal VDD and the driving unit 238. The PMOS transistor P232 and the NMOS transistor N232 are connected in series, and the PMOS transistor P233 and the NMOS transistor N233 are connected in series. The PMOS transistor P232 and the NMOS transistor N232 are respectively connected in parallel to the PMOS transistor P233 and the NMOS transistor N233. The comparison result X is output from a node between the PMOS transistor P232 and the NMOS transistor N232. That is, when the first output voltage Vx1 is greater than the reference voltage Vref, the comparison result X of a low level is output.

Each of the second and third differential amplification units has a similar construction as the first differential amplification unit. That is, each of the second and third differential amplification units shares the PMOS transistor P233 and the NMOS transistor N233 of the first differential amplification unit. Furthermore, the comparison result Y is output from a node between a PMOS transistor P234 and an NMOS transistor N234, and the comparison result Z is output from a node between a PMOS transistor P236 and an NMOS transistor N236. In a similar way, when the second output voltage Vy1 is greater than the reference voltage Vref, the comparison result Y of a low level is output. When the third output voltage Vz1 is greater than the reference voltage Vref, the comparison result Z of a low level is output. Accordingly, in the case where a cell string included in the sample memory cell block 210 has been erased or programmed, all of the comparison results X, Y, and Z have a low level.

The state storage unit 240 stores the comparison results X, Y, and Z, received from the comparison unit 230, in the form of digital code data. A detailed construction of the state storage unit 240 is described below with reference to the drawing.

Figure 6:
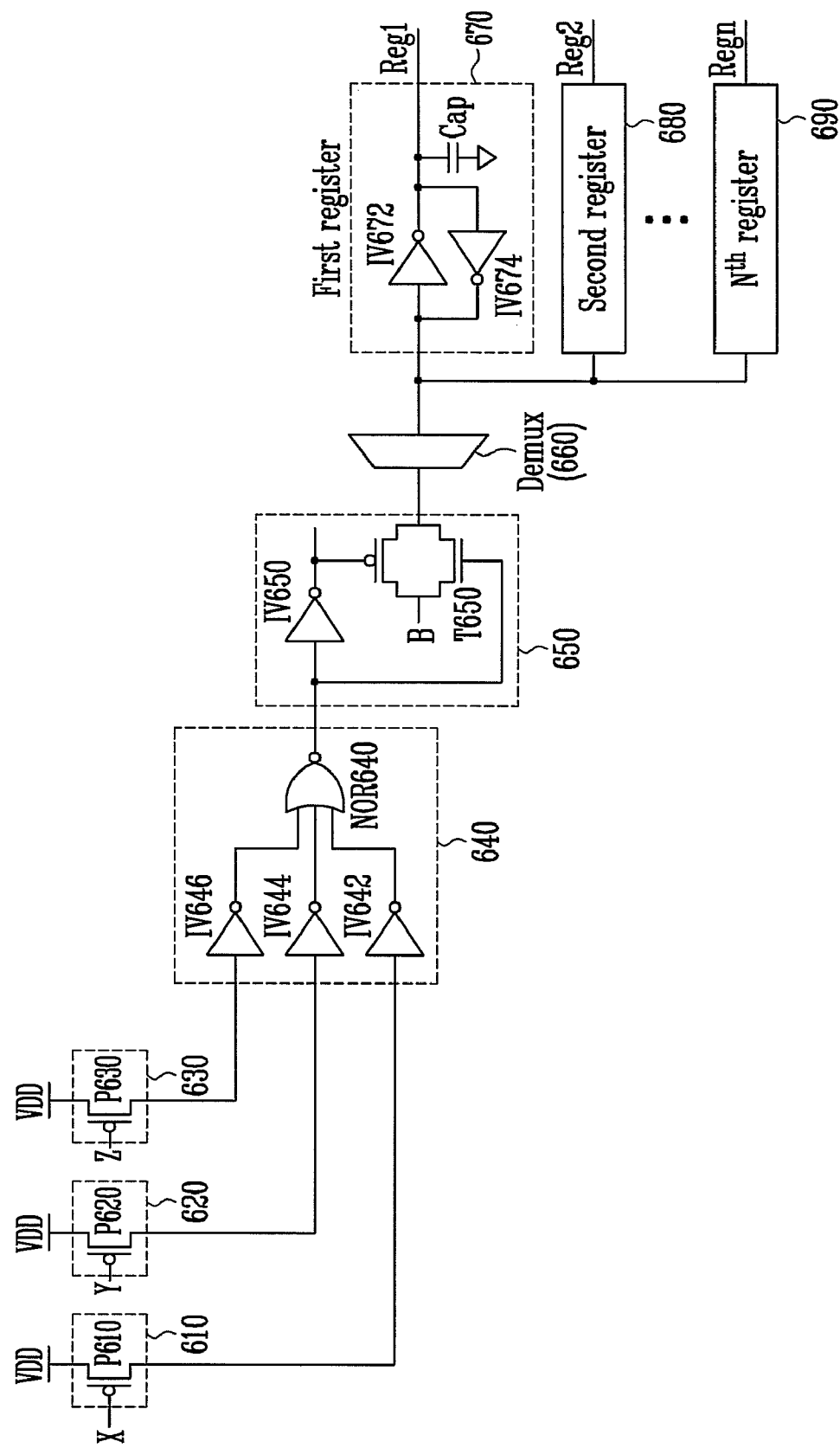
FIG. 6 is a circuit diagram of a state storage unit according to an embodiment.

FIG. 6 is a circuit diagram of the state storage unit according to an embodiment.

The state storage unit 240 includes first to third pull-up units 610, 620, and 630 configured to output power supply voltages VDD depending on the respective comparison results X, Y, and Z, a logic combination unit 640 configured to logically combine the outputs of the pull-up units, a data setting unit 650 configured to output a high-level voltage B depending on the output of the logic combination unit 640, and a demux 660 configured to selectively store the output of the data setting unit 650 in any one of first to $n^{th}$ registers 670-690. The first to $n^{th}$ registers 670-690 are connected to the demux 660 and are configured to sequentially store the output of the data setting unit 650.

The pull-up units 610, 620, and 630 include respective PMOS transistor P610, P620, P630. The PMOS transistors are connected between the respective power supply terminals VDD and the logic combination unit 640 and are turned on depending on the respective comparison results X, Y, and Z. Accordingly, when the comparison results X, Y, and Z have a low level (i.e., in the case where an erase or program operation has been completed), the pull-up units 610, 620, and 630 transfer the respective comparison results X, Y, and Z of a high level to the logic combination unit 640.

The logic combination unit 640 includes inverters IV642, IV644, and IV646 configured to invert the respective outputs of the pull-up units 610, 620, and 630 and a NOR gate NOR640 configured to perform a NOR operation on the outputs of the inverters IV642, IV644, and IV646. Accordingly, only when all of the comparison results X, Y, and Z have a high level, the NOR gate NOR640 outputs a high-level signal.

The data setting unit 650 includes an inverter IV650 configured to invert the output signal of the logic combination unit 640 and a transfer gate T650 configured to output the high-level voltage B depending on the output signal of the logic combination unit 640. Accordingly, only when the NOR gate NOR640 outputs the high-level signal, the data setting unit 650 outputs the high-level voltage B to the demux 660.

The demux 660 transfers the high-level voltage B, received from the data setting unit 650, to the registers 670, 680 to 690. The demux 660 selectively transfers the signal, received from the data setting unit 650, to one of the registers depending on the number of program/erase cycles. For example, at the first program/erase cycle, the demux 660 may store the signal in the first register 670 and, at the second program/erase cycle, may store the signal in the second register 680.

Each of the registers 670, 680 to 690 includes a latch comprising inverters IV672 and IV674. Accordingly, when the high-level voltage B is received from the demux 660, a low-level voltage is stored in the output terminal Reg of each of the registers.

As described above, if a specific memory cell string has been erased or programmed, all of the comparison results X, Y, and Z of the comparison unit 230 have a low level, so the logic combination unit 640 outputs the high-level signal. Accordingly, low-level data is stored in a specific one of the registers.

The high voltage generation unit 250 controls the voltage level of a program voltage, an erase voltage or the like depending on the state information of each memory cell, stored in the state storage unit 240. This is described in detail below with reference to the drawing.

Figure 7:
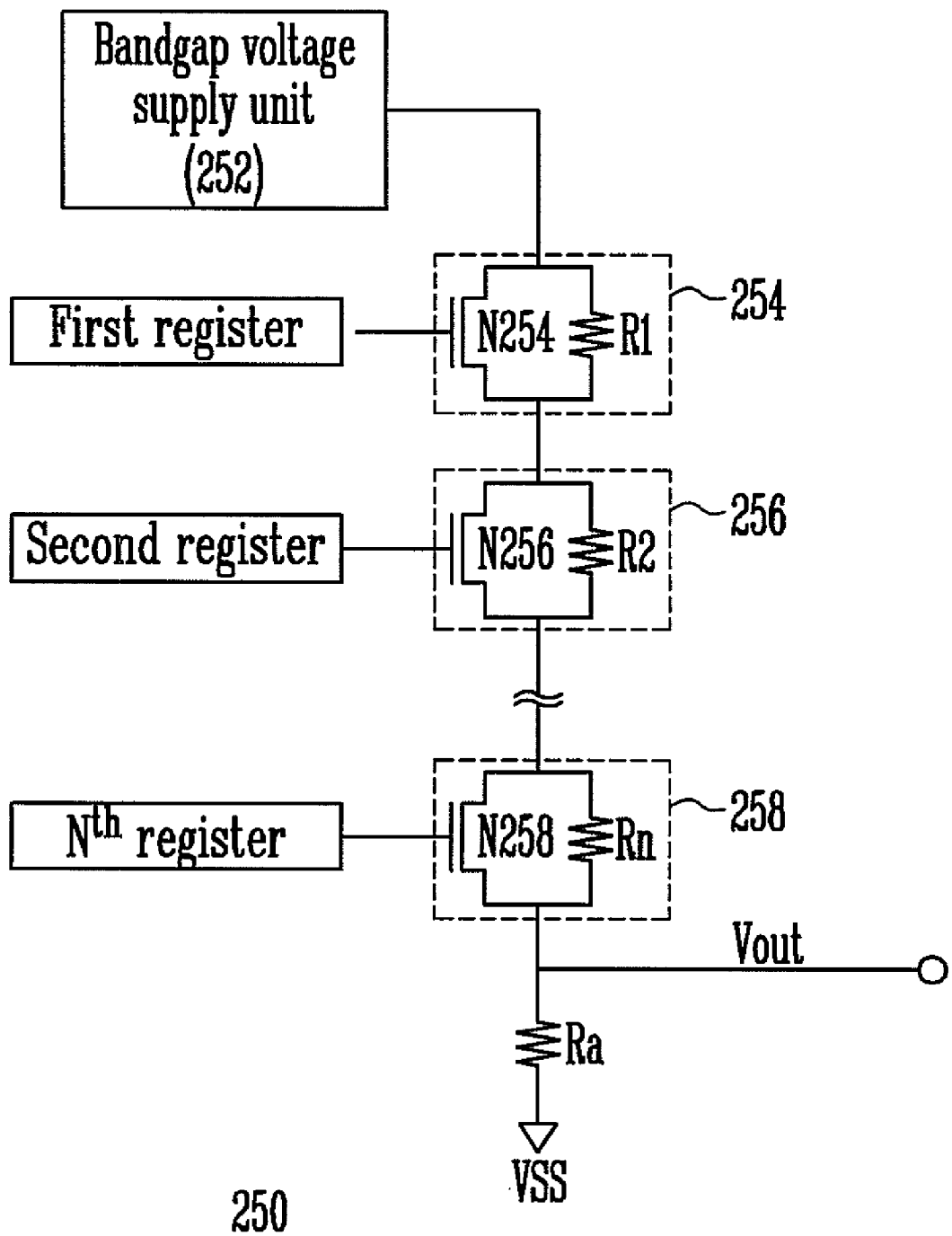
FIG. 7 is a circuit diagram of a high voltage generation unit according to an embodiment.

FIG. 7 is a circuit diagram of the high voltage generation unit according to an embodiment.

The high voltage generation unit 250 includes a bandgap voltage supply unit 252 configured to supply a constant high voltage to first to $n^{th}$ voltage control units 254, 256 and 258 configured to divide and distribute the high voltage (i.e., the output of the bandgap voltage supply unit 252) depending on data stored in each of the registers of the state storage unit 240, and a resistor Ra. The $n^{th}$ voltage control unit 258 includes an $n^{th}$ resistor Rn and an $n^{th}$ switching element N258. The $n^{th}$ switching element N258 is connected in parallel to the $n^{th}$ resistor and is configured to short both terminals of the $n^{th}$ resistor depending on data stored in the $n^{th}$ register. Furthermore, the voltage control units 254, 256 and 258 are connected in series between the output terminal of the bandgap voltage supply unit 252 and the resistor Ra.

Accordingly, when high-level data is stored in the $n^{th}$ register Rn, the $n^{th}$ switching element N258 of the $n^{th}$ voltage control unit 258 is turned on, so both terminals of the $n^{th}$ resistor Rn are shorted.

According to the above construction, a ratio where the output voltage of the bandgap voltage supply unit 252 is divided and distributed differs depending on data stored in each of the registers of the state storage unit 240. Accordingly, the level of an output voltage Vout differs.

An erase method and a program method using the nonvolatile memory device according to an embodiment are described below.

Figure 8:
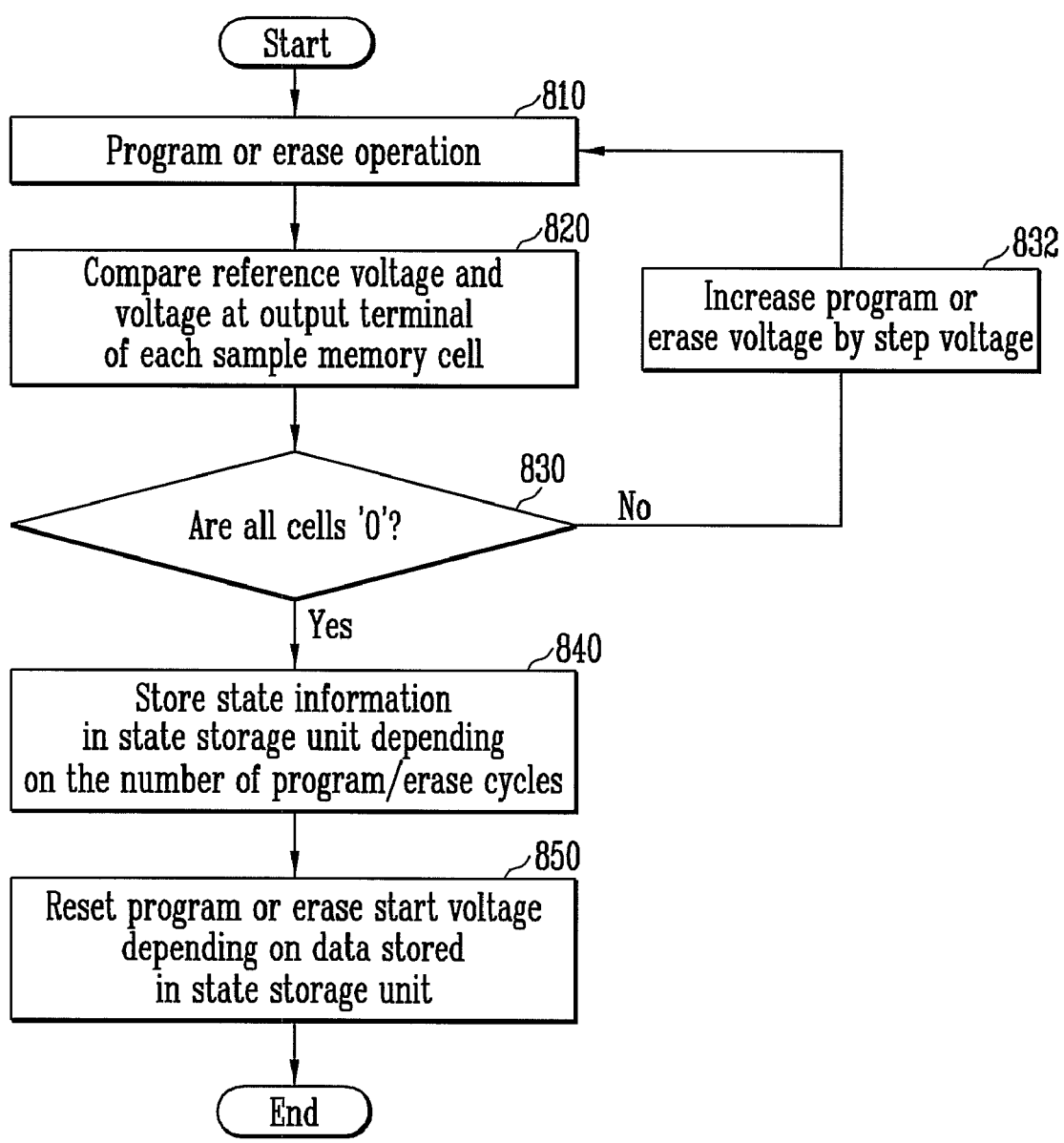
FIG. 8 is a flowchart showing an erase method or a program method using the nonvolatile memory device according to an embodiment.

FIG. 8 is a flowchart showing an erase method or a program method using the nonvolatile memory device according to an embodiment.

First, a program operation or an erase operation is selected at step 810. The method may select the program method or the erase method.

The comparison unit 230 compares a reference voltage Vref and each of voltages Vx1, Vy1, and Vz1 at the respective output terminals of sample memory cells at step 820. As described above, in the state where the program or erase operation has been completed, all of the comparison results X, Y, and Z of the comparison unit 230 have a low level (i.e., '0').

It is then determined whether all of the comparison results X, Y, and Z have a low level at step 830. If, as a result of the determination, all of the comparison results X, Y, and Z are determined not to have a low level, a program voltage or an erase voltage is increased by a step voltage at step 832. Next, a program operation using the ISPP method or an erase operation using the ISPE method is then repeatedly performed.

However, if, as a result of the determination at step 830, all of the comparison results X, Y, and Z are determined to have a low level, state information is stored in the state storage unit 240 depending on the number of program/erase cycles at step 840. That is, at the first program/erase cycle, state information is stored in the first register and, at the second program/erase cycle, state information is stored in the second register.

A program or erase start voltage is set again depending on data stored in the state storage unit 240 at step 850.

That is, a ratio in which the high voltage generation unit 250 divides and distributes a voltage differs depending on data stored in each of the registers of the state storage unit 240, so that the level of the output voltage Vout differs. At the first operation, high-level data is stored in each of the registers of the state storage unit 240. Accordingly, the output voltage Vout has the same level as the output voltage of the high voltage generation unit 250. As the number of program/erase cycles increases, low-level data is stored in each of the registers of the state storage unit 240. Consequently, resistance in the voltage control units increases, so that the level of the output voltage Vout decreases. Here, an output voltage output at the first program/erase cycle is set to be higher than an output voltage output at the second program/erase cycle. This is for the purpose of applying a high program start voltage at the first program or erase operation and applying a lower program start voltage depending on the increasing number of program/erase cycles. Accordingly, an increase in the program speed, resulting from the increasing number of program/erase cycles, can be compensated for. Meanwhile, during an erase operation, an erase start voltage is set to increase with the increasing number of program/erase cycles. That is, if the number of program/erase cycles increases, the program speed increases, thereby making the erase operation difficult to operate. For this reason, the erase start voltage is increased.

Accordingly, the nonvolatile memory device which is capable of applying a different program voltage or a different erase voltage with the increasing number of program/erase cycles can be provided.

What is claimed is:

1. A nonvolatile memory device, comprising:
    a comparison unit configured to compare a reference voltage and a voltage of each of a plurality of nodes of a sample memory cell string;
    a state storage unit configured to store state information of each of memory cells depending on the corresponding comparison result of the comparison unit; and
    a high voltage generation unit configured to change a program start voltage depending on data stored in the state storage unit.

2. The nonvolatile memory device of claim 1, wherein the comparison unit comprises differential amplification units each configured to compare the reference voltage and the voltage of each of the nodes.

3. The nonvolatile memory device of claim 1, wherein the state storage unit comprises:
    pull-up units each configured to output a power supply voltage depending on each of the comparison results;
    a logic combination unit configured to logically combine the outputs of the pull-up units;
    a data setting unit configured to output a high-level voltage depending on an output of the logic combination unit;
    a demux configured to selectively store the output of the data setting unit in a register of a plurality of registers; and
    the registers connected to the demux and configured to sequentially store the output of the data setting unit.

4. The nonvolatile memory device of claim 3, wherein the logic combination unit comprises:
    inverters each configured to invert the output of each of the pull-up units; and
    a NOR gate configured to perform a NOR operation on the outputs of the inverters.

5. The nonvolatile memory device of claim 3, wherein the data setting unit comprises:
    an inverter configured to invert an output of the logic combination unit; and
    a transfer gate configured to transfer the high-level voltage to the demux depending on an output of the logic combination unit and an output of the inverter.

6. The nonvolatile memory device of claim 1, wherein the high voltage generation unit comprises:
    a bandgap voltage supply unit configured to apply a constant high voltage; and
    voltage control units each configured to divide and distribute the high voltage depending on data stored in each of registers of the state storage unit.

7. The nonvolatile memory device of claim 6, wherein each of the voltage controls units comprises:
    a resistor; and
    a switching element connected in parallel to the resistor and configured to short both terminals of the resistor depending on the data stored in the corresponding register of the state storage unit.

8. A program method using a nonvolatile memory device, comprising:
    performing a program operation according to a selected program start voltage;
    comparing a reference voltage and each of output voltages of specific nodes of sample memory cells;
    repeatedly performing the program operation until each of the output voltages is greater than the reference voltage by increasing a program voltage by a step voltage at each repetition compared to that of the previous program operation;
    storing state information, indicating that each of the output voltages is higher than the reference voltage whenever a selected program/erase cycle is completed; and
    changing a level of the program start voltage depending on the stored state information.

9. The program method of claim 8, wherein the change in the level of the program start voltage comprises decreasing the level of the program start voltage with an increasing number of program/erase cycles.

10. An erase method using a nonvolatile memory device, comprising:

performing an erase operation according to a selected erase start voltage;

comparing a reference voltage and each of output voltages of a plurality of nodes of sample memory cells;

repeatedly performing the erase operation until each of the output voltages is greater than the reference voltage by increasing an erase voltage by a step voltage at each repetition compared to that of the previous program operation;

storing state information, indicating that each of the output voltages is higher than the reference voltage whenever a selected erase/erase cycle is completed; and changing a level of the erase start voltage depending on the stored state information.

11. The erase method of claim 10, wherein the change in the level of the erase start voltage comprises increasing the level of the erase start voltage with an increasing number of erase/erase cycles.

* * * * *